United States Patent
Yoon et al.

(10) Patent No.: US 9,556,514 B2
(45) Date of Patent: Jan. 31, 2017

(54) SPATIAL DEPOSITION OF MATERIAL USING SHORT-DISTANCE RECIPROCATING MOTIONS

(71) Applicant: Veeco ALD Inc., Fremont, CA (US)

(72) Inventors: Jeong Ah Yoon, Hwaseong-Si (KR); Suk Yal Cha, San Jose, CA (US); Seung Yeop Baek, Chungcheongnam-do (KR); Daniel H. Lee, Burlingame, CA (US); Samuel S. Pak, San Ramon, CA (US); Daniel Yang, Cupertino, CA (US); Sang In Lee, Los Altos Hills, CA (US)

(73) Assignee: Veeco ALD Inc., Fremont, CA (US)

( * ) Notice: Subject to any disclaimer, the term of this patent is extended or adjusted under 35 U.S.C. 154(b) by 21 days.

(21) Appl. No.: 14/604,332

(22) Filed: Jan. 23, 2015

(65) Prior Publication Data

US 2015/0218698 A1     Aug. 6, 2015

Related U.S. Application Data

(60) Provisional application No. 61/936,554, filed on Feb. 6, 2014.

(51) Int. Cl.
| | | |
|---|---|---|
| *C23C 16/00* | (2006.01) | |
| *C23C 16/54* | (2006.01) | |
| *C23C 16/04* | (2006.01) | |
| *C23C 16/455* | (2006.01) | |

(52) U.S. Cl.
CPC ......... *C23C 16/04* (2013.01); *C23C 16/45551* (2013.01); *C23C 16/45578* (2013.01); *C23C 16/545* (2013.01)

(58) Field of Classification Search
CPC ................... C23C 16/45525; C23C 16/45548; C23C 16/45551; C23C 16/00; C23C 16/458; C23C 16/54; C23C 16/545
See application file for complete search history.

(56) References Cited

U.S. PATENT DOCUMENTS

| | | | |
|---|---|---|---|
| 2009/0165715 A1 | 7/2009 | Oh | |
| 2010/0159395 A1* | 6/2010 | Fyson | ................... G03F 7/0043 430/302 |
| 2011/0120757 A1* | 5/2011 | Levy | ..................... C23C 16/042 174/256 |
| 2012/0021128 A1 | 1/2012 | Dickey | |

(Continued)

OTHER PUBLICATIONS

Poodt, Paul, et al., "High-Speed Spatial Atomic-Layer Deposition of Aluminum Oxide Layers for Solar Cell Passivation". Advanced Materials, 2010, 22, 3564-3567.*

(Continued)

*Primary Examiner* — Bret Chen
(74) *Attorney, Agent, or Firm* — Fenwick & West LLP

(57) ABSTRACT

Deposition of material is performed on a substrate by causing short-distance reciprocating motions of the substrate that improve uniformity of material on the substrate. A series of reactors for injecting material onto the substrate is arranged along the length of the substrate in a repeating manner. During each reciprocating motion, the susceptor moves a distance shorter than an entire length of the substrate. Portions of the substrate are injected with materials by a subset of reactors. Since the movement of the substrate is smaller, a linear deposition device including the susceptor may be made smaller.

14 Claims, 12 Drawing Sheets

(56) References Cited

U.S. PATENT DOCUMENTS

| | | |
|---|---|---|
| 2012/0094149 A1 | 4/2012 | Lee et al. |
| 2012/0098146 A1 | 4/2012 | Lee |
| 2012/0225192 A1 | 9/2012 | Yudovsky et al. |
| 2013/0260034 A1* | 10/2013 | Pak .................. C23C 16/45544 427/248.1 |
| 2013/0323422 A1 | 12/2013 | Peidous |

OTHER PUBLICATIONS

Illiberi, A., et al., "Spatial Atomic Layer Deposition of Zinc Oxide Thin Films". Applied Materials & Interfaces, 2012, 4, 268-272.*

Poodt, Paul, et al., "Spatial atomic layer deposition: A route towards further industrialization of atomic layer deposition". J. Vac. Sci. Technol. A 30(1), Jan./Feb. 2012, 010802-1 to 010802-11.*

Munoz-Rojas, David, et al., "Spatial atmospheric atomic layer deposition: a new laboratory and industrial tool for low-cost photovoltaics". Mater. Horiz., 2014, 1, 314-320.*

Roozeboom, Fred, et al., "Spatial Atomic Layer Deposition (ALD): a novel disruptive technology". Semicon Europa 2013, Oct. 8-10, Dresden, Germany.*

PCT International Search Report and Written Opinion, PCT Application No. PCT/US2015/012739, May 22, 2015, 12 pages.

* cited by examiner

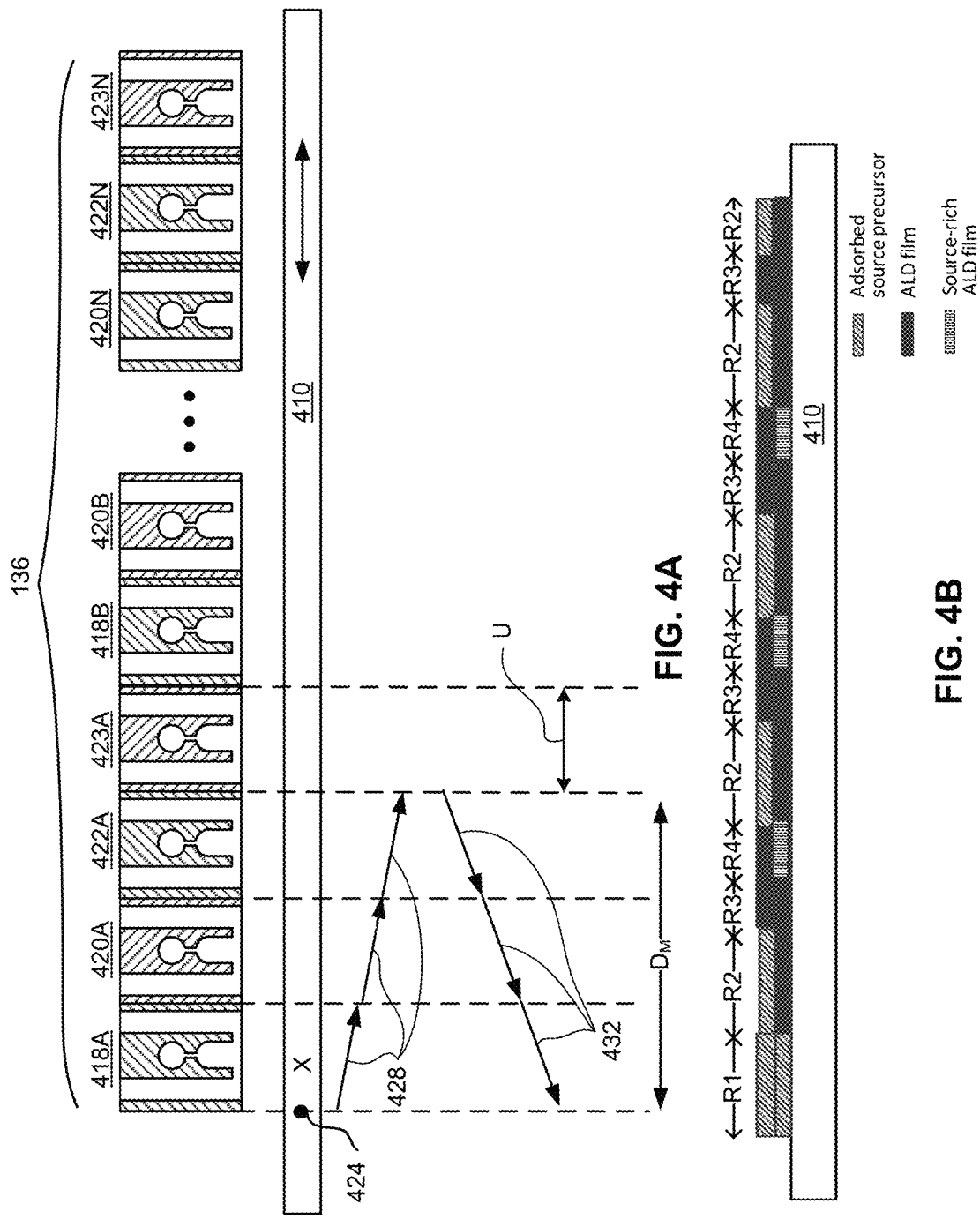

SPATIAL DEPOSITION OF MATERIAL USING SHORT-DISTANCE RECIPROCATING MOTIONS

CROSS-REFERENCE TO RELATED APPLICATION

This application claims priority under 35 U.S.C. 119(e) to U.S. Provisional Application Ser. No. 61/936,554 filed on Feb. 6, 2014, which is incorporated by reference herein in its entirety.

BACKGROUND

1. Field of Art

The present disclosure relates to depositing one or more layers of materials on a substrate using vapor phase deposition.

2. Description of the Related Art

An atomic layer deposition (ALD) is a thin film deposition technique for depositing one or more layers of material on a substrate. ALD uses two types of chemical, one is a source precursor and the other is a reactant precursor. Generally, ALD includes four stages: (i) injection of a source precursor, (ii) removal of a physical adsorption layer of the source precursor, (iii) injection of a reactant precursor, and (iv) removal of a physical adsorption layer of the reactant precursor. ALD can be a slow process that can take an extended amount of time or many repetitions before a layer of desired thickness can be obtained. Hence, to expedite the process, a vapor deposition reactor with a unit module (so-called a linear injector), as described in U.S. Patent Application Publication No. 2009/0165715 or other similar devices may be used to expedite ALD process. The unit module may include an injection unit and an exhaust unit for a source material (collectively a source module), and an injection unit and an exhaust unit for a reactant (collectively a reactant module). To deposit different films or laminates onto the substrate, different source precursors and/or reactant precursors can be injected into different modules.

A spatial ALD vapor deposition chamber has one or more sets of reactors for performing spatial ALD on substrates. Spatial ALD refers to a process where source precursor, purge gas, reactant precursor and purge gas are sequentially injected onto a moving substrate to form a layer of film thereon. As the substrate passes below the reactors, the substrate is exposed to the source precursor, a purge gas and the reactant precursor. The source precursor molecules deposited on the substrate reacts with reactant precursor molecules or the source precursor molecules are replaced with the reactant precursor molecules to deposit a layer of material on the substrate. After exposing the entire substrate to the source precursor or the reactant precursor, the substrate may be exposed to the purge gas to remove excess source precursor molecules or reactant precursor molecules from the substrate.

The substrate and the reactors may be moved by a reciprocating movement where the substrate is exposed to the precursor molecules in a different sequence during a forward stroke and a backward stroke. In order to expose the entire substrate to the precursor molecules or purge gas, the substrate or the reactor may have to travel a long distance. Hence, the vapor deposition reactor may be very large to accommodate the reciprocal movement of the substrate or the reactor.

SUMMARY

Embodiments relate to depositing a layer of material on a substrate by using short-distance reciprocating movements. Relative movements between a substrate and reactors in a first direction and relative movements between the substrate and the reactors in a second direction by a second distance are repeated for a predetermined number of times. The first distance is shorter than a length of the substrate but longer than the second distance. The first direction is opposite to the second direction. Then, a relative movement between the substrate and the reactors in the first direction by a third distance shorter than the length of the substrate and a relative movement between the substrate and the reactors in the second direction by a fourth distance longer than the third distance are made. Gas or radicals are injected by each of the reactors during the relative movements of the substrate and the reactors.

In one embodiment, the relative movement by the third distance and the relative movement by the fourth distance are repeated for a predetermined number of times.

In one embodiment, the first and fourth distances are the same, and the second and third distances are the same.

In one embodiment, a difference between the first and second distances is the same as a different between the fourth and third distances.

In one embodiment, an offset representing the difference between the first distance and the second distance is smaller than a width of a reactor.

In one embodiment, a first subset of the reactors injects source precursor onto the substrate. A second subset of the reactors injects reactant precursor onto the substrate. A third subset of the reactors injects purge gas onto the substrate.

In one embodiment, the layers of material are deposited on the substrate by spatial atomic layer deposition (ALD) or chemical vapor deposition (CVD).

Embodiments also relate to a deposition device that causes a substrate to make short-distance reciprocating motions during the injection of gas onto the substrate by reactors. The deposition device includes a susceptor, a set of reactors and an actuator. The susceptor holds a substrate. The reactors are arranged along a direction in which the susceptor moves. Each reactor injects gas or radicals onto a portion of the substrate. The actuator is coupled to the susceptor. The susceptor repeats movements of the susceptor in a first direction by a first distance shorter than a length of the substrate and movements of the susceptor in a second direction opposite to the first direction by a second distance shorter than the first distance for a predetermined number of times. The susceptor also moves in the first direction by a third distance shorter than the length of the substrate, and moves in the second direction by a fourth distance longer than the third distance.

Embodiments also relate to a deposition device for a flexible substrate that moves on a support table. The support table has a flat top surface. A set of reactors is placed over the support table and arranged along the direction in which the flexible substrates moves. A roller assembly is fixed relative to the support table and slides a flexible substrate on the flat top surface of the support table in a first direction. An actuator assembly causes reciprocating relative movements of the support table relative to the set of reactors in the first direction and in a second direction opposite to the first direction.

In one embodiment, the relative speed of the roller sliding on the flat top surface is lower than the reciprocating speed of the support table.

BRIEF DESCRIPTION OF DRAWINGS

FIG. 4A is a diagram illustrating movements of a substrate to deposit material on the substrate using a short-distance reciprocation, according to one embodiment.

FIG. 4B is a cross sectional diagram illustrating a configuration of material deposited on a substrate by using the method of FIG. 4A.

DETAILED DESCRIPTION OF EMBODIMENTS

Figure 1:
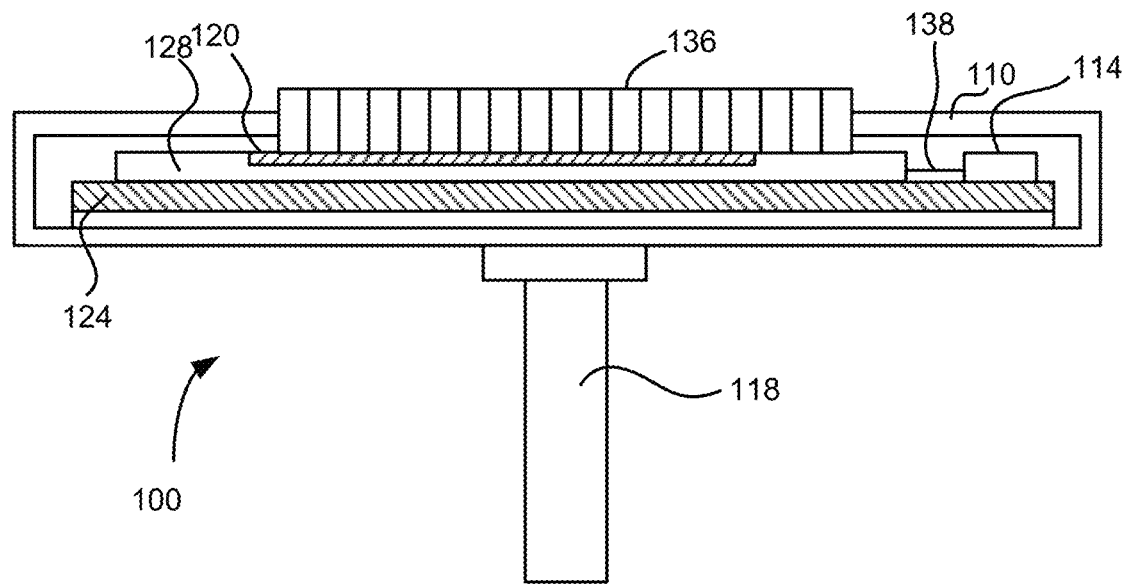
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to performing deposition of material on a substrate by causing short-distance reciprocating movements of the substrate. A series of reactors for injecting material onto the substrate is arranged along the length of the substrate in a repeating manner. During each reciprocating movement, the susceptor moves a distance shorter than an entire length of the substrate. Portions of the substrate are injected with materials by a subset of reactors. Since the movement of the substrate is smaller, a linear deposition device including the susceptor may be made smaller. Despite using the short-distance reciprocating motions, the consistency and uniformity of the deposited layer can be enhanced by mixing the reciprocating motions with shifting motions or differing the forward and backward moving distances of the substrate during the reciprocating motions.

Although following embodiments are primarily directed to moving a substrate relative to the reactors for convenience of explanation, the substrate may remain in a stationary location while moving the reactors. Furthermore, both the substrate and the reactors may be moved to deposit material on the substrate.

Further, although the following embodiments are described primarily using atomic layer deposition (ALD) to deposit material on a substrate, the same principle may be applied to other methods of depositing material such as molecular layer deposition (MLD) and chemical vapor deposition (CVD).

Figure 2:
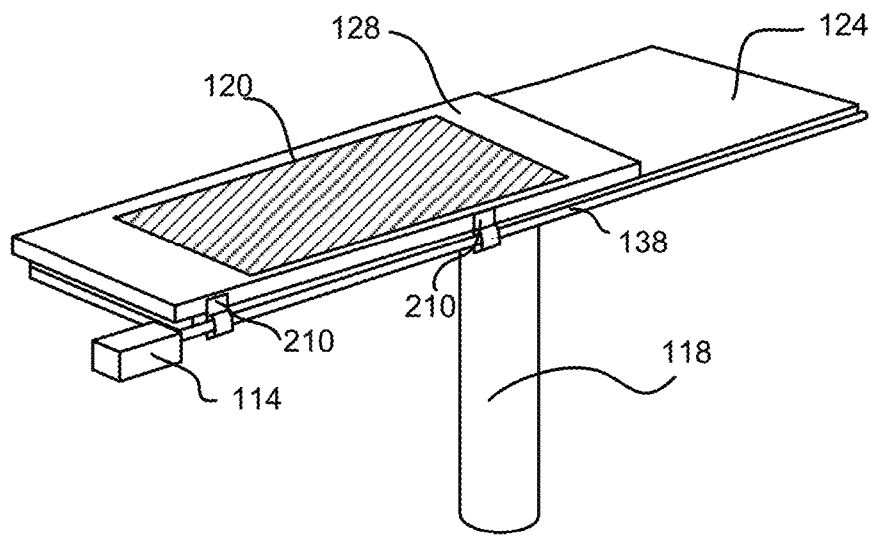
FIG. 2 is a perspective view of a linear deposition device, according to one embodiment.

Figure (FIG. 1 is a cross sectional diagram of a linear deposition device 100, according to one embodiment. FIG. 2 is a perspective view of the linear deposition device 100 (without chamber walls 110 to facilitate explanation), according to one embodiment. The linear deposition device 100 may include, among other components, a support pillar 118, the process chamber 110 and one or more reactors 136. The reactors 136 may include one or more of injectors and radical reactors. Each of the injector modules injects source precursors, reactant precursors, purge gases or a combination of these materials onto the substrate 120.

The reactors 136 may be arranged for a spatial ALD process as well as Chemical Vapor Deposition (CVD) process. The spatial ALD process may be performed by sequential injecting source precursor, purge gas, reactant precursor and purge gas onto a substrate 120. CVD process can be performed by injecting both source precursor and reactant precursor and mixing these precursors in reactors and then injecting the mixed precursors onto the substrate 120.

The process chamber enclosed by the walls 110 may be maintained in a vacuum state to prevent contaminants from affecting the deposition process. The process chamber 110 contains a susceptor 128 which receives the substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins that facilitate loading of the substrate 120 onto the susceptor 128 or dismounting of the substrate 120 from the susceptor 128.

In one embodiment, the susceptor 128 is secured to brackets 210 that moves across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. The linear movement may include short-distance reciprocation or shifting motions of the support plate 124 that cause the substrate to move, as described below in detail with reference to FIGS. 6 and 8 through 12. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3A:
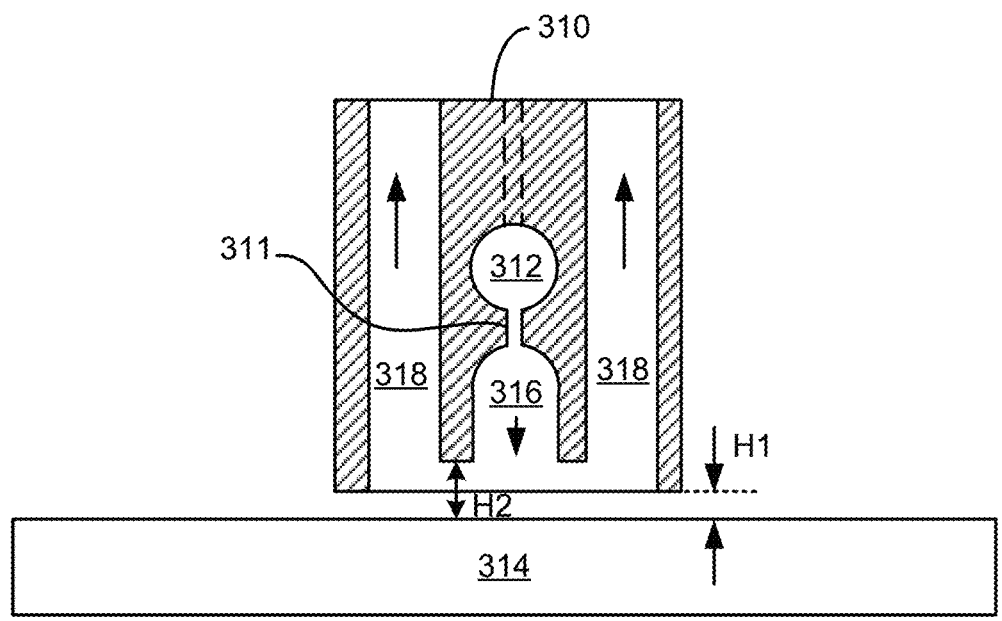
FIG. 3A is a cross sectional diagram illustrating a reactor, according to one embodiment.

FIG. 3A is a diagram illustrating a reactor 310 according to one embodiment. The reactor 310 may be an injector for injecting source precursor, reactant precursor, purge gas or a combination thereof onto a substrate 314. As illustrated, the reactor 310 is raised above the substrate 314 by height H1 (e.g., from 0.5 mm to 3 mm) to provide sufficient clearance for the substrate 314 to pass below the reactor 310.

Injector 310 receives source precursor, reactant precursor, purge gas or a combination thereof via a pipe and injects the source precursor into its chamber 316 via a channel 312 and holes 311 formed in the injector 310. Below the chamber 316, source precursor, reactant precursor, purge gas or a combination thereof comes into contact with the substrate 314. The remaining gas is ejected via a constriction zone (having a height of H2) to outlets 318. In the constriction zone, the speed of the gas flow is increased, facilitating removal of redundant gas from the surface of the substrate 314.

Figure 3B:
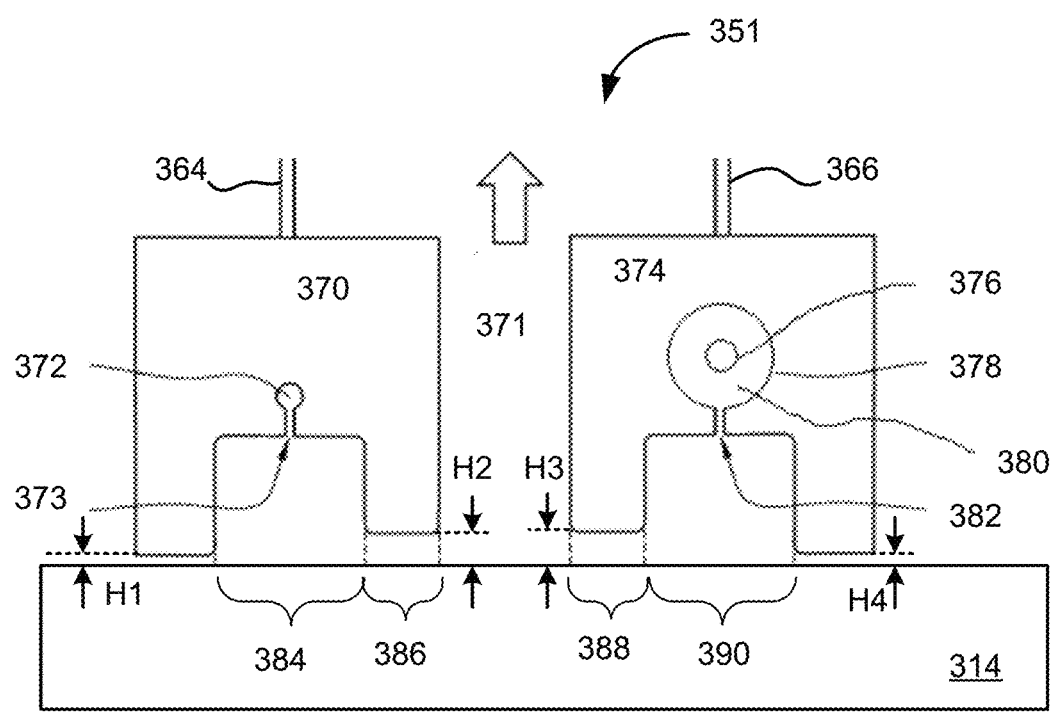
FIG. 3B is a cross sectional diagram illustrating a reactor according to another embodiment.

FIG. 3B is a diagram illustrating an injector 370 and a radical reactor 374, according to one embodiment. As illustrated, the injector 370 is raised above the substrate 314 by height H1, and the radical reactor 374 is raised above the substrate 314 by height H4 to provide sufficient clearance for the substrate 314 to pass below the injector 370 and the radical reactor 374.

The injector 374 receives gas via a pipe 364 and injects the gas into its chamber 384 via a channel 372 and holes 373 formed in the injector 370. The gas injected via the injector 374 may be a source precursor, a reactant precursor, a purge gas or gases for any other purpose. Within the chamber 384, the gas then comes into contact with the substrate 314 and performs the function as precursors or purge gas. The remaining gas is discharged via a constriction zone 386 (having height of H2) to an outlet 371. In the constriction zone 386, the speed of the gas flow is increased, facilitating removal of redundant gas from the surface of the substrate 314.

The radical reactor 374 receives gas via pipe 366. The gas is injected into a cavity 380 between an inner electrode 376 and an outer electrode 378. Voltage is applied across the inner electrode 376 and the outer electrode 378 so that when the gas is injected into the cavity 380, plasma of the gas generates radicals in the cavity 380. The radicals of the gas are then injected into a chamber 390 where the radicals come in contact with the substrate 314. Radicals reverted to inactive state as well as some redundant radicals pass through a constriction zone 388 (having height of H3) and are discharged via the outlet 371.

The reactors of FIGS. 3A and 3B are merely illustrative. Various other types of reactors may be used in the linear deposition device 100. In alternative embodiments, the reactors may include only injectors, only radical reactors, more than two injectors and radical reactors or radical reactors/injectors in a different sequence.

FIG. 4A is a diagram illustrating a series of injectors 136 arranged along the moving direction of a substrate 410, according to one embodiment. The series of injectors may include injectors 418A through 418N for injecting source precursor onto the substrate 410 and injectors 422A through 422N for injecting reactant precursor onto the substrate 410. Injectors 420A through 420N and injectors 423A through 423N inject purge gas onto the substrate 410 to remove excessive source or reactant precursor molecules from the substrate 410. For the sake of simplicity, all injectors are assumed to have the same width of U. Although not illustrated, radical reactors or injectors for injecting purge gas onto the substrate 410 may also be included in the series of injectors.

One way of performing atomic layer deposition (ALD) on the substrate 410 is by moving the substrate 410 in one direction (e.g., forward) by a certain stroke distance and then moving back the substrate 410 in the opposite direction (e.g., backward) by the same stroke distance. For example, the substrate 410 may be moved by three unit distances U to the right and then back to the original location where unit distance U corresponds to the width of an injector.

As reference point 424 of the substrate 410 moves to the right by 3 U as shown by arrows 428 (i.e., a forward stroke), a portion (denoted by "X" in FIG. 4A) of the substrate on the right side of the reference point 424 is sequentially injected with a source precursor by injector 418A, a purge gas by an injector 420A, a reactant precursor by injector 422A, and a purge gas by injector 423A. Subsequently, as reference point 424 of the substrate 410 moves to the left by 3 U as shown by arrows 432 (i.e., a backward stroke), the same portion of the substrate is exposed to source precursor, purge gas and reactant precursor in a reverse sequence. The total distance of movement $D_M$ of the substrate 410 in this example is 3 U, which is shorter than the entire length of the substrate 410.

Depending on the locations of the substrate 410, different portions of the substrate 410 are exposed to materials in a different sequence. However, by making movements of the substrate 410 as illustrated in FIG. 4A, different layers of material are deposited on different portions of the substrate 410 as illustrated in FIG. 4B.

Based on the sequence of the injected material, the substrate 410 include a portion R1 only adsorbed with source precursor, portions R2 with an ALD layer at the bottom and source precursor adsorbed on the ALD layer, portions R3 deposited with two ALD layers, and portions R4 with ALD layer rich in source precursor at the bottom and a typical ALD layer on the top. Hence, the deposition of materials on the substrate 410 is uneven and inconsistent across the length (i.e., moving direction) of the substrate 410.

Such uneven and inconsistent deposition results in stripe patterns across the top surface of the substrate 410. The uneven and inconsistent deposition of material on the substrate 410 may cause different portions of the substrate to have different properties such as different levels of transparency and a film stress level. For example, the transparent deposited layer may show color fringe patterns due to different thicknesses across the substrate. Also, different exposure time of either source precursor or plasma across the substrate may result in different composition or residual impurities due to different concentration of adsorbed source precursor or radicals.

Figure 5:
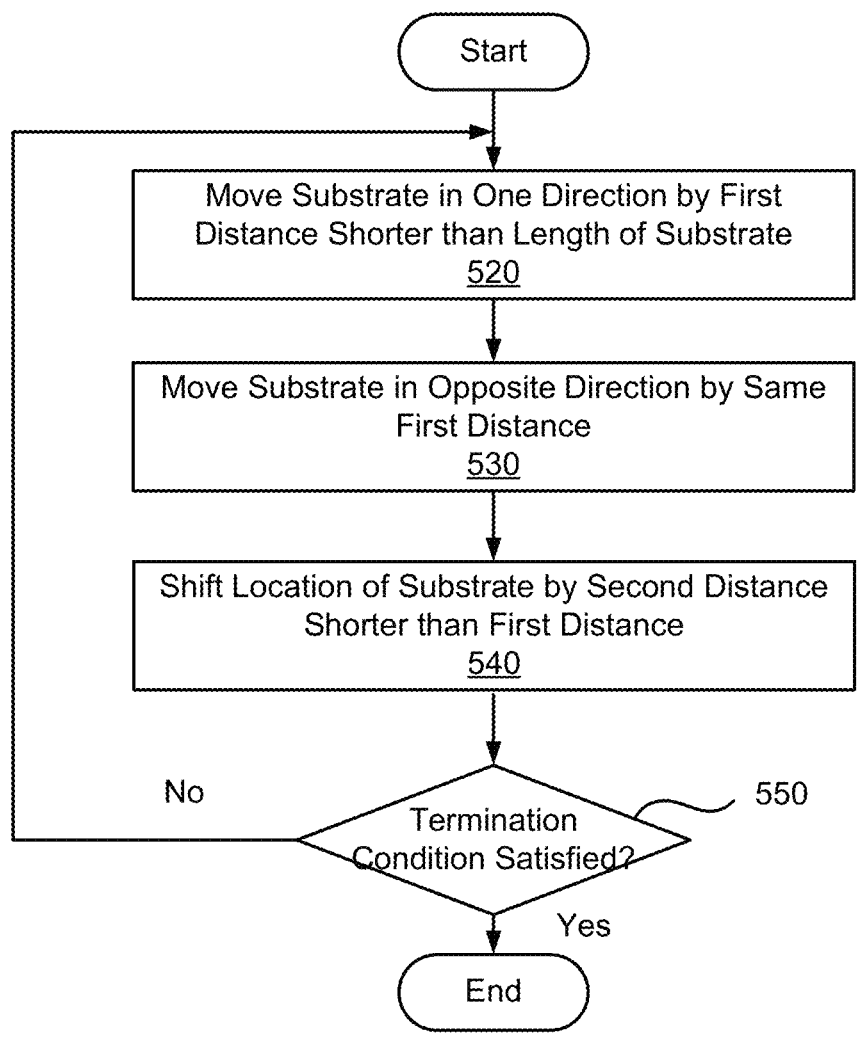
FIG. 5 is a flowchart illustrating a process of depositing material using a short-distance reciprocation and shifting of a substrate, according to one embodiment.
Figure 6:
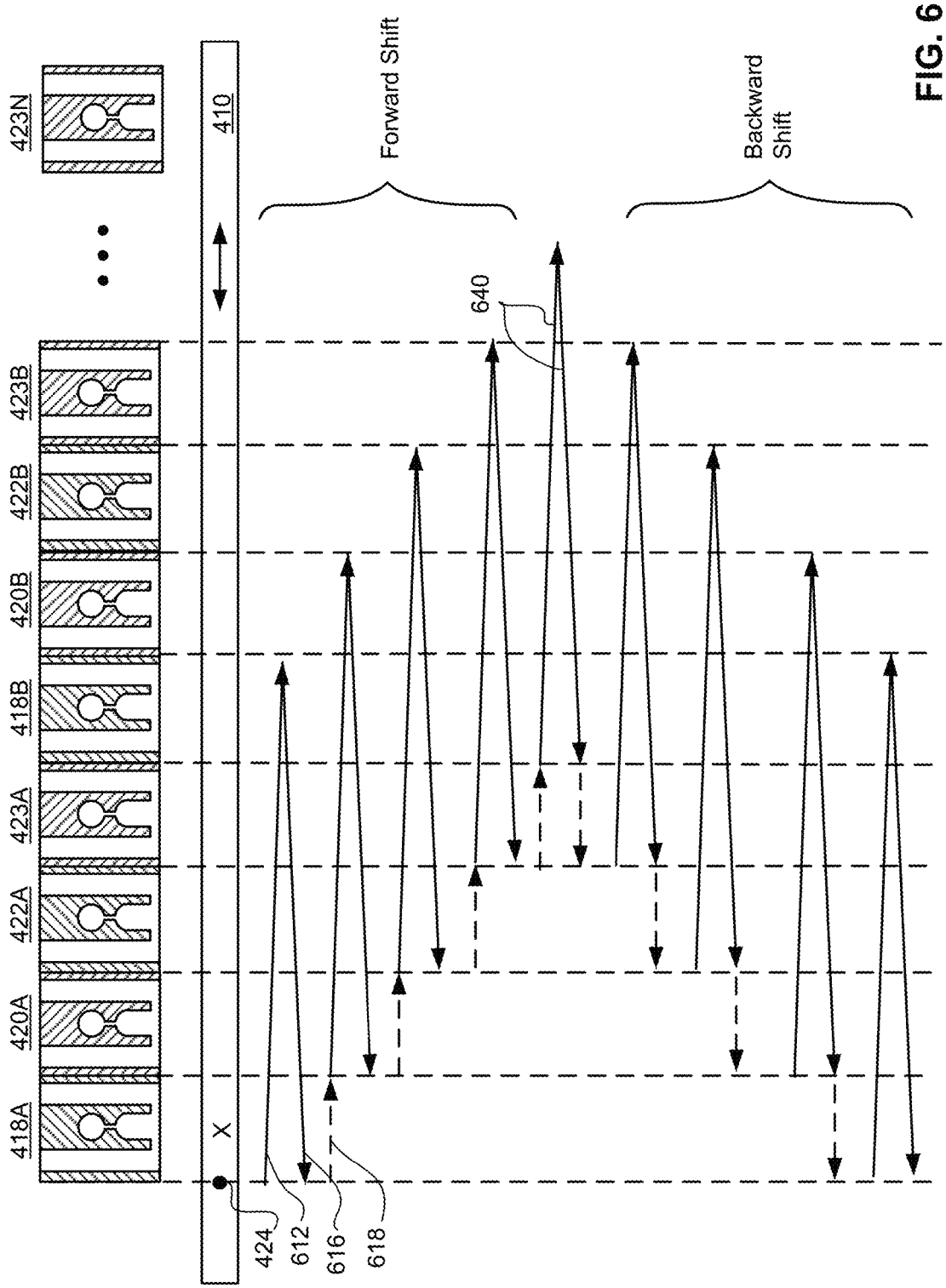
FIG. 6 is a diagram illustrating movements of a substrate to deposit material on the substrate using short-distance reciprocations and shifting of the substrate, according to one embodiment.

FIG. 5 is a flowchart illustrating a method of depositing a material on a substrate by reciprocating the substrate for a short distance and then shifting the location of substrate, according to one embodiment. First, the substrate is moved 520 in one direction (e.g., forward) by a first distance shorter than the length of the substrate while injectors are injecting the precursor materials onto the substrate. Referring to FIG. 6, a reference point 424 on the substrate 410 is moved 5 units to the right as shown by arrow 616.

Then the substrate is moved in the opposite direction (e.g., backward) by the same first distance while the injectors are injecting the precursor materials onto the substrate. Taking the example of FIG. 6, the reference point 424 moves to the left 5 units as shown by arrow 616.

After completing a single reciprocating motion (as indicated by arrows 612, 616), the location of the susceptor is shifted 540 by a second distance that is shorter than the first distance. "Shifting" herein refers to an operation where the substrate is moved with the injectors shut off so that no precursor material is injected onto the surface of the substrate. In the example of FIG. 6, the reference point 424 is shifted in the right direction (i.e., forward) by one unit as shown by arrow 618.

It is then determined 550 if the termination condition has been satisfied. If so, the process terminates. If not, the process returns to moving 520 susceptor in one direction by the first distance. In the example of FIG. 6, the four reciprocating motions are made to progressively move the substrate 410 to the right (i.e., forward) per each reciprocating motion with a shifting motion performed between each reciprocating motion. A single reciprocating motion is made at a location furthest from the original point (as indicated by arrows 640), and then subsequent four reciprocating motions are made to progressively move the substrate 410 to the left (i.e., backward).

Motions indicated in FIG. 6 may be repeated with the reference point 424 initially placed at the same location to deposit additional layers of materials on the substrate 410. Alternatively, the reference point 424 of the substrate 410 may be shifted for a predetermined distance (e.g., 20 units) and then the motions indicated in FIG. 6 may be perform ALD process on a different portion of the substrate.

It is to be note that the substrate 410 moves in the right direction (i.e., forward direction) by the maximum of 5 units during the reciprocating motions of FIG. 6. Compared to conventional way of moving the substrate across its entire length, the overall moving distance of movement of substrate 410 in FIG. 6 is significantly reduced, and therefore, the size of the vapor deposition reactor can be reduced significantly even if the size of the substrate 410 remains the same.

The numbers of unit distance for moving the substrate in FIG. 6 is merely illustrative. More or fewer units of distance may be moved during the reciprocating motions. Further, the shifting movement may also be longer or shorter than the unit distance as illustrated in FIG. 6.

Figure 7:
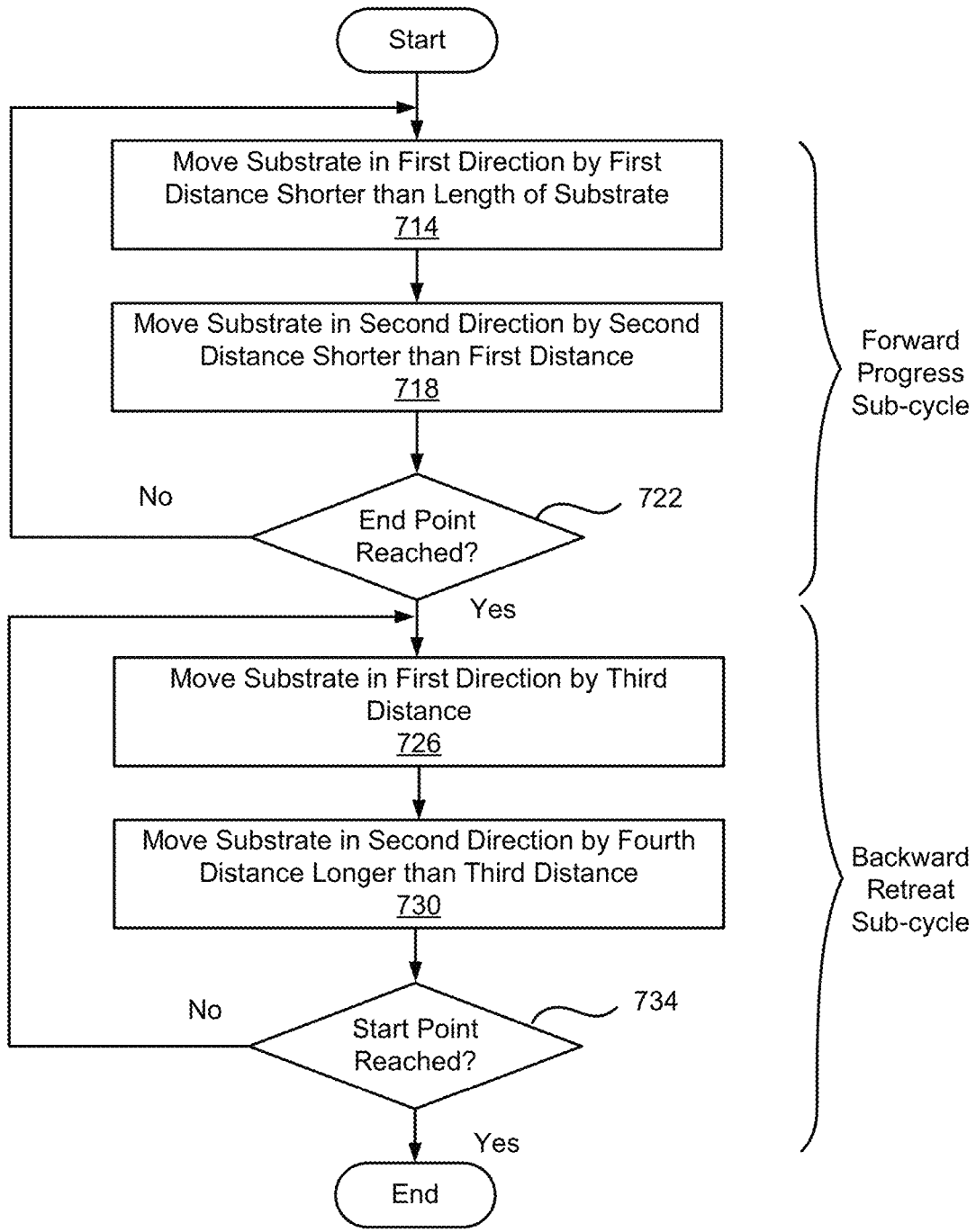
FIG. 7 is a flowchart illustrating a process of depositing material using short-distance reciprocations with different forward and backward stroke distances, according to one embodiment.

FIG. 7 is a flowchart illustrating a process of depositing material using short-distance reciprocations with different forward and backward stroke distances, according to one embodiment. The process includes a forward process sub-cycle and a backward retreat sub-cycle.

First, the substrate is moved 714 in a first direction (e.g., forward) for a first distance that is shorter than the length of the substrate while injectors are injecting the precursor materials onto the substrate. Then, the substrate is moved 718 in a second direction (e.g., backward) opposite to the first direction for a second distance that is shorter than the first distance while the injectors are injecting the precursor materials onto the substrate. The movement in the second direction concludes a single reciprocating motion of the forward progress sub-cycle.

Since the second distance is shorter than the first distance, the substrate ends at a position progressed toward the first direction after conclusion of each reciprocating motion in the forward progress sub-cycle. Then it is determined 722 if the end point is reached (e.g., forward-most position of the substrate). If not, the process returns to moving 714 the susceptor in the first direction.

If the end point is reached, then the backward retreat sub-cycle is initiated. First, the substrate is moved 726 in the first direction for the third distance. The third distance may be the same as the second distance or different from the second distance. Then, the substrate is moved 730 in the second direction for the fourth distance. The fourth distance may be the same as the first distance or different from the first distance. Since the fourth distance is longer than the third distance, the substrate ends at a position moved towards the second direction after the reciprocating motion. Then it is determined 734 if the start point is reached (e.g., backward-most position of the substrate). If not, the process returns to moving 726 the susceptor in the first direction by the third distance.

Figure 8:
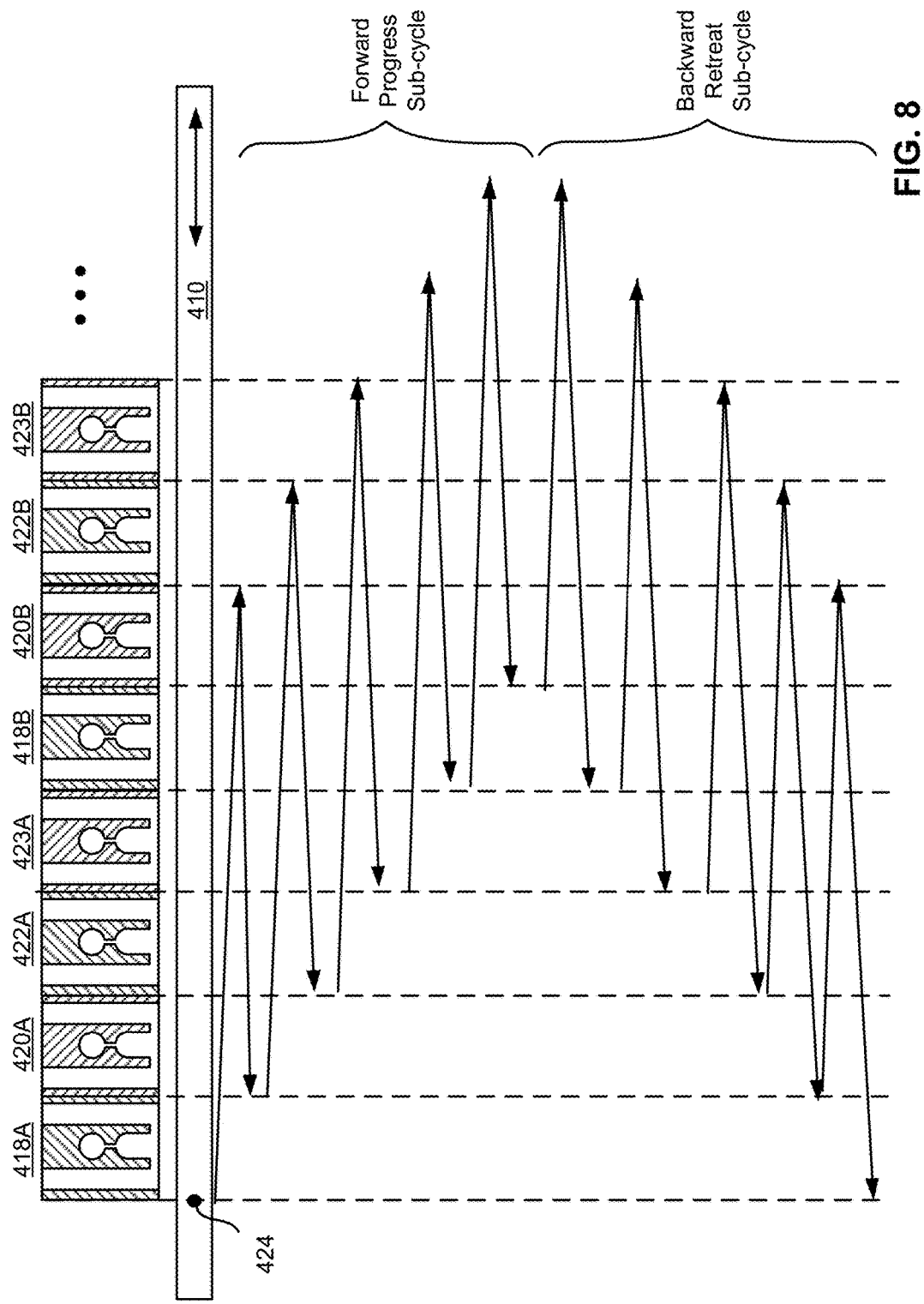
FIGS. 8 through 11 are diagrams illustrating movements of a substrate to deposit material on the substrate using short-distance reciprocations with different forward and backward stroke distances, according to one embodiment.

FIG. 8 is a diagram illustrating reciprocating motions of the substrate 410, according to one embodiment. In FIG. 8, arrows indicate the starting and ending locations of reference point 424 on the substrate 410. In this embodiment, the substrate 410 moves in the right direction (i.e., forward direction) by a first distance of 6 units and then moves in the left direction (i.e., backward direction) by a second distance of 5 units in a single reciprocating cycle. A unit described herein corresponds to the width of a single reactor. That is, after concluding a single reciprocating motion, the substrate 410 progresses one unit to the right.

In the embodiment of FIG. 8, the substrate 410 repeats such reciprocating motions 5 times, progressing 5 units towards the right (i.e., forward) at the end of the forward progressing sub-cycle. 5 reciprocating motions collectively form forward progress sub-cycle.

Then a backward retreat sub-cycle is initiated. During the backward retreat sub-cycle, the substrate 410 moves 5 units to the right (i.e., forward) and then moves 6 units to the left (i.e., backward). After repeating such reciprocating movements for 5 times, substrate 410 returns to the original location.

After one forward progress sub-cycle and one backward retreat sub-cycle (each sub-cycle consisting of 5 reciprocating movements) are finished, sub-cycles may be repeated to deposit additional layers of material on the substrate 410. Alternatively, the reference point 424 of the substrate 410 may be shifted for a predetermined distance (e.g., 20 units) and then the motions indicated in FIG. 8 may be perform ALD process on a different portion of the substrate.

Compared to the embodiment of FIG. 6, the embodiment of FIG. 8 yields more uniform deposition of material on the substrate 410. As a result, stripe patterns are less apparent on the substrate 410. It is also to be noted that the substrates moves to the right at most by 5 units during the sub-cycles. Further, operations to shut off the injectors are not needed during the forward progress sub-cycle and the backward retreat sub-cycle.

Figure 9:
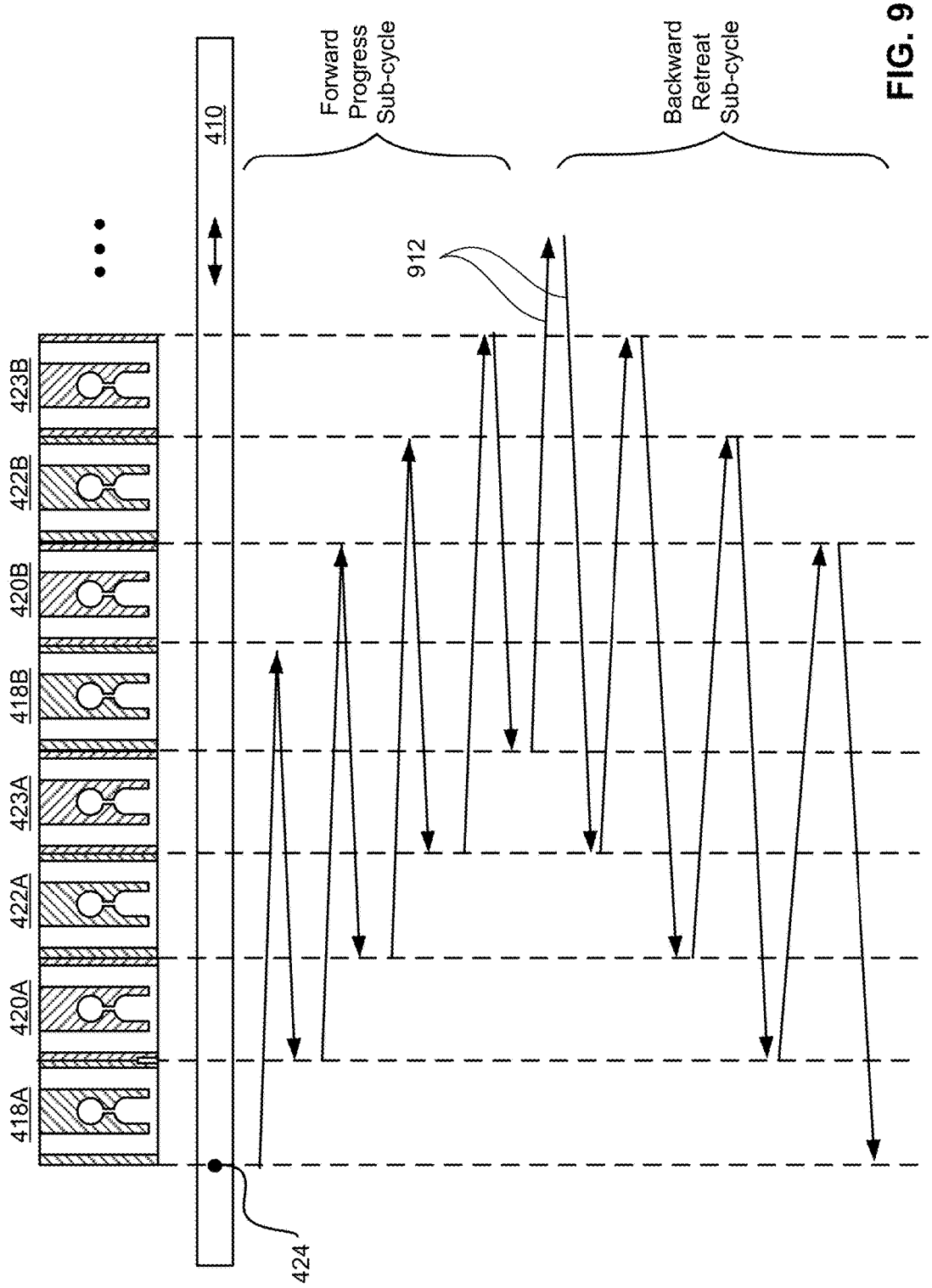

FIG. 9 is a diagram illustrating reciprocating motions of the substrate 410, according to one embodiment. In FIG. 9, arrows indicate the starting and ending locations of reference point 424. In this embodiment, the forward progress sub-cycle is started by moving the substrate to the right (i.e., forward) by a first distance of 5 units and then moving to the left (i.e., backward) by a second distance of 4 units in a single reciprocating motion. After concluding a single reciprocating cycle, the substrate 410 progresses one unit to the right.

In the embodiment of FIG. 9, the substrate 410 repeats such reciprocating motions 4 times, progressing 4 units toward to the right (i.e., forward) at the end of the forward progressing sub-cycle.

Then a backward retreat sub-cycle is initiated where the substrate 410 moves 5 units to the right and then moves 6 units to the left. After repeating such reciprocating movements for 4 times, substrate 410 returns to its original location.

After one forward progress sub-cycle and one backward retreat sub-cycle (each sub-cycle consisting of 4 reciprocating movements) are finished, sub-cycles may be repeated to deposit additional layers of material on the substrate 410. Alternatively, the reference point 424 of the substrate 410 may be shifted for a predetermined distance (e.g., 20 units) and then the motions indicated in FIG. 9 may be perform ALD process on a different portion of the substrate.

It is to be noted that the deposition of material becomes more uniform and consistent as the offset between the forward stroke distance and backward stroke distance of the reciprocating movement is reduced. Further, the offset need not be an integer of the unit distance. The offset may be less than one unit as described below in detail with reference to FIGS. 10 and 11.

Figure 10:
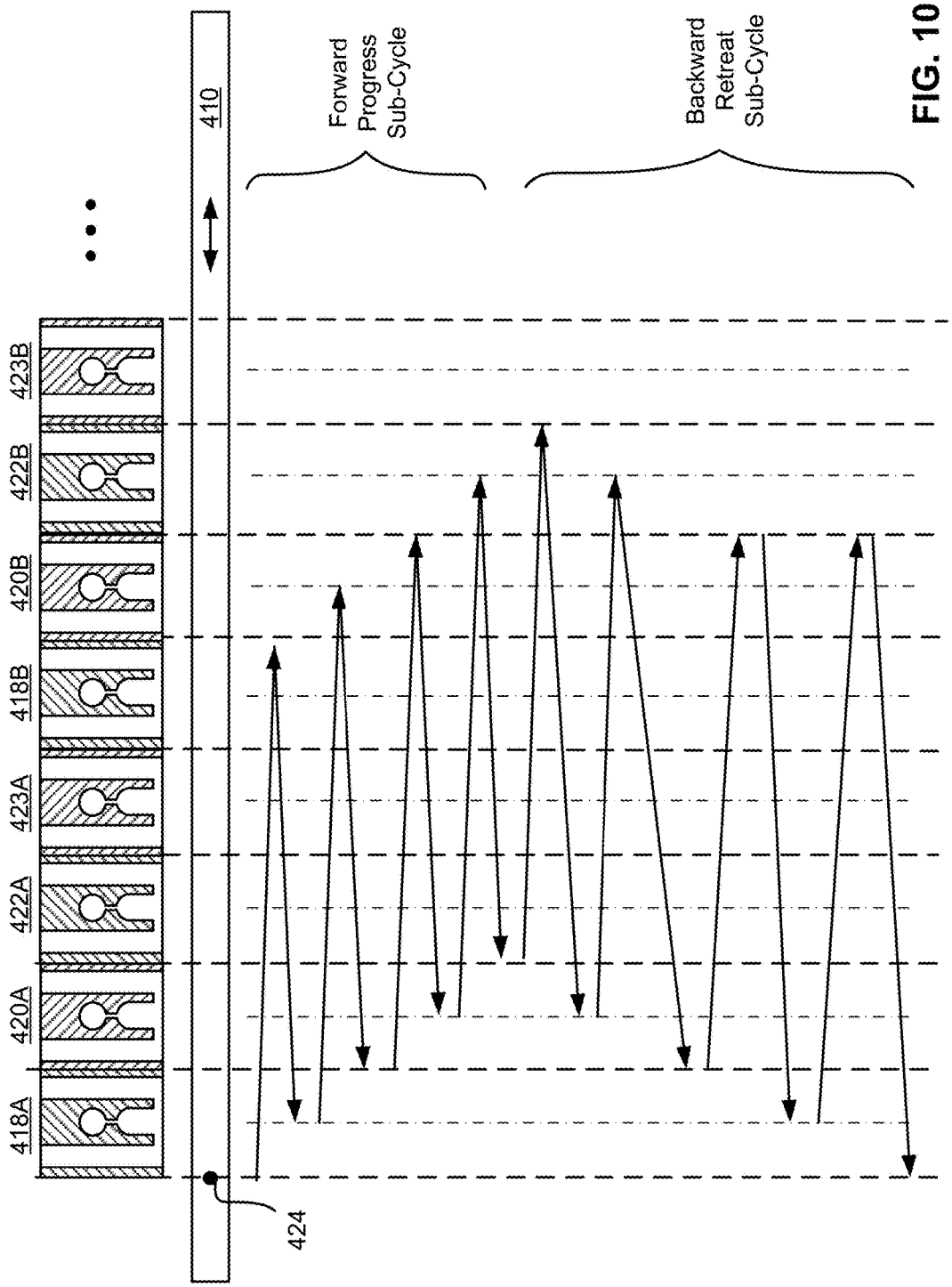

FIG. 10 is a diagram illustrating reciprocating motions of the substrate 410 where the offset is 0.5 unit, according to one embodiment. In this embodiment, the substrate moves to the right (i.e., forward) by a first distance of 5 units and then moves back to the left (i.e., backward) by a second distance of 4.5 units in a single reciprocating motion. That is, after concluding a single reciprocating cycle, the substrate 410 progresses 0.5 unit.

In the embodiment of FIG. 10, the substrate 410 repeats such reciprocating motions 4 times, progressing 2 units toward the right at the end of the forward progressing sub-cycle. Then a backward retreat sub-cycle is initiated during which the substrate 410 moves 5 units to the right and then moves 5.5 units to the left. After repeating such reciprocating movement for 4 times, substrate 410 returns to its original location.

After one forward progress sub-cycle and one backward retreat sub-cycle are finished, these sub-cycles may be repeated to deposit additional layers of material on the substrate 410.

Progressing or retreating the substrate by 0.5 units to the left or to the right per each reciprocating motion is advantageous, among other reasons, because the material is deposited on the substrate in a more uniform and consistent manner compared to embodiments of FIGS. 8 and 9.

Figure 11:
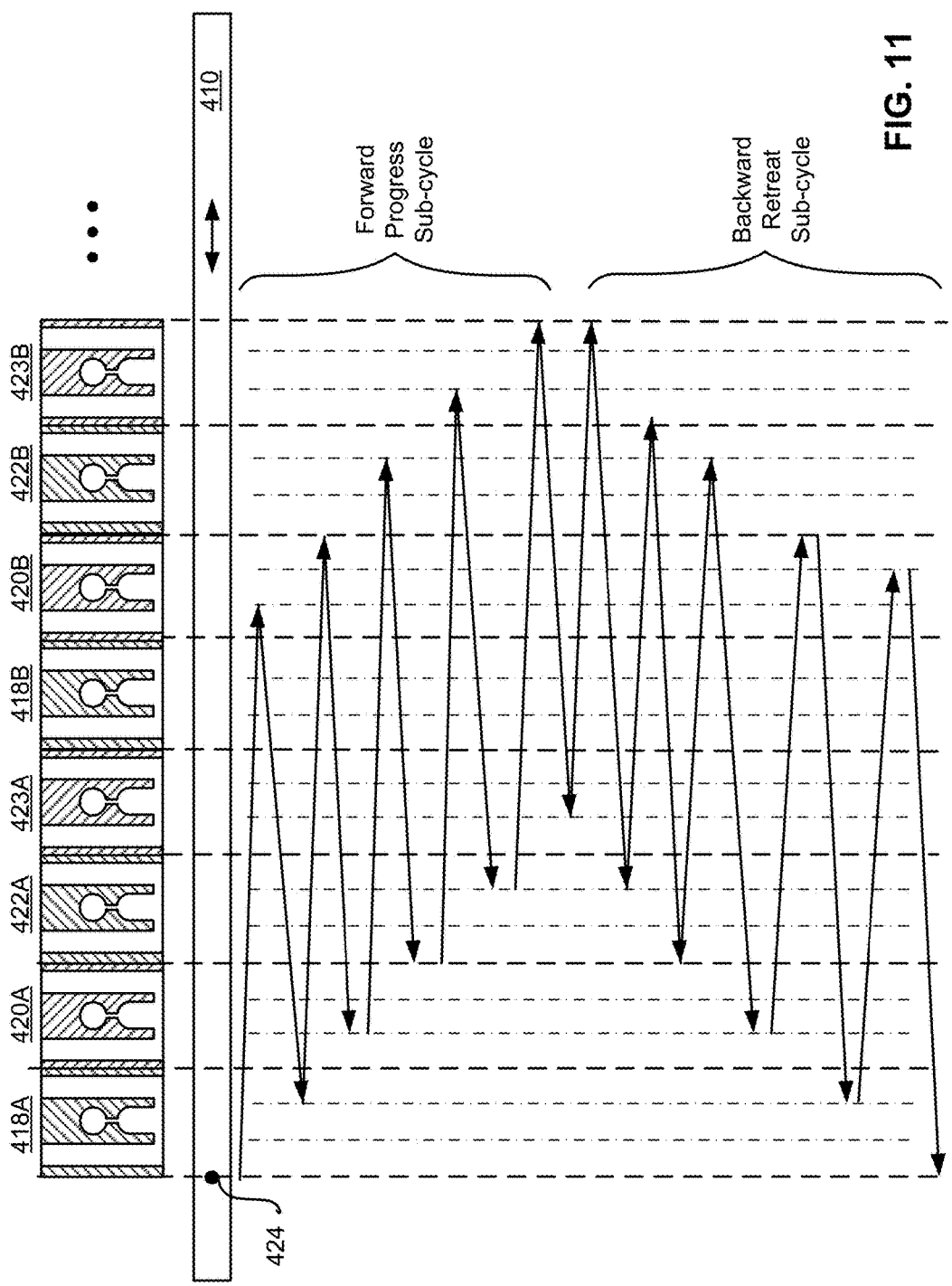

FIG. 11 is a diagram illustrating reciprocating motions of the substrate 410 where the offset is ⅓ unit, according to one embodiment. In this embodiment, the substrate 410 moves 4 and ⅔ units by the forward stroke and moves 5 and ⅓ units by the backward stroke during a backward retreat sub-cycle. The forward process sub-cycle is repeated 5 times and the backward retreat sub-cycle is also repeated 5 times. After repeating the forward process sub-cycle and the backward retreat sub-cycles, the substrate 410 returns to its original location.

Although embodiments described above with reference to FIGS. 8 through 11 has the starting and ending points in the forward progress sub-cycle coinciding with the starting and ending points in the backward retreat sub-cycle, other embodiments may differ the starting and ending points during the forward process sub-cycle and the backward retreat sub-cycle. By differing the starting and ending points in the forward progress sub-cycle and the backward retreat sub-cycle, stripe patterns on the substrate caused by uneven deposition can be removed or alleviated.

Figure 12:
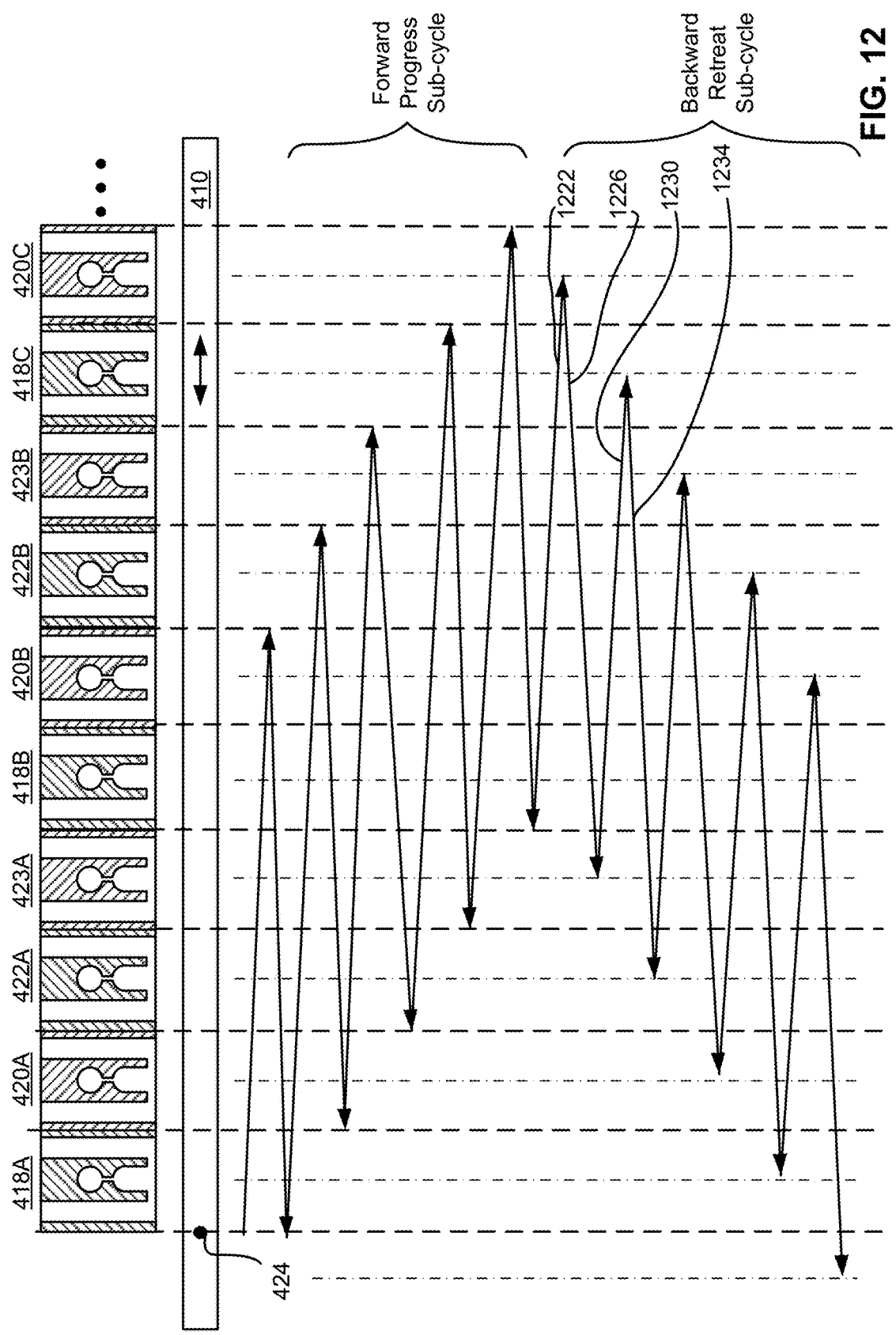
FIG. 12 is a diagram illustrating movements of a substrate to deposit material on the substrate using short-distance reciprocations where the starting and ending points during a forward progress sub-cycle and a backward retreat sub-cycle differ, according to one embodiment.

FIG. 12 is a diagram illustrating movements of a substrate to deposit material on the substrate using short-distance reciprocations during which the starting and ending points during a forward progress sub-cycle and a backward retreat sub-cycle differ, according to one embodiment. In the embodiment of FIG. 12, the process is initiated by moving the substrate 424 to the right (i.e., forward) for 6 units and then to the left (i.e., backward) for 6 units. During this reciprocation motion, the substrate 410 is exposed to source precursor, purge gas and reactant precursor by the injectors.

Then, the forward progress sub-cycle is initiated by moving the substrate 410 in the right direction (i.e., forward direction) by 7 units and then moving the substrate 410 in the left direction (i.e., backward direction) by 6 units. Hence, the substrate 410 moves one unit to the right after a single reciprocation motion in the forward progress sub-cycle. The reciprocation motions are repeated 4 times to move the substrate 410 in the right direction for 4 units during the forward progress sub-cycle.

Then the backward retreat sub-cycle is initiated by moving the substrate 410 to the right for 5.5 units (as shown by arrow 1222) and then moving the substrate 410 to the left for 6 units (as shown by arrow 1226). After the first backward retreat reciprocation motion, the substrate 410 ends at a location 0.5 units to the left. Then a second reciprocation motion moves the substrate 410 to the right by 5 units (as shown by arrow 1230) and then moves the substrate 410 to the left by 6 units (as shown by arrow 1234). Accordingly, the substrate 410 ends at a location 1 unit to the left after concluding the second reciprocation motion.

The reciprocation motions same as the second reciprocation motion is repeated for three more times during the backward retreat sub-cycle to move the substrate 410 to the left 0.5 units from the original position where the substrate 410 started the forward progress sub-cycle.

In the embodiment of FIG. 12, starting and ending points differ in the forward progress sub-cycle and the backward retreat sub-cycle. That is, each reciprocation motion in the forward progress sub-cycle has a different starting and ending location that is different from each reciprocation motion in the backward retreat sub-cycle. By differing the starting and ending locations in the forward progress sub-cycle and the backward retreat sub-cycle, material may be deposited on the substrate 410 in a more consistently.

The starting and ending points of the forward progress sub-cycle and the backward retreat sub-cycle may be differed also by making the last reciprocation movement in the forward progress sub-cycle to move in the right direction by a distance that is different from the distance moved in the right direction in other reciprocating movements of the forward progress sub-cycle, instead of making the first reciprocating movement in the backward retreat subs-cycle to move in the left direction by a distance that is different from the distance moved to in the left direction in other reciprocating movements of the backward retreat sub-cycle, as shown in FIG. 12. For example, in the last reciprocation movement of the forward progress sub-cycle, the substrate 410 may move to the right by 6.5 units or 7.5 units instead of 7 units as described above with reference to the embodiment of FIG. 12. In this example, the substrate 410 may move to the left by 6 units and move to the right by 5 units in all reciprocating motions in the backward retreat sub-cycle. It is also possible to move the substrates by irrational number of times of the unit (e.g., 7.1 U or 7.2 U or 7.3 U or 7.4 U) in the forward progress sub-cycle or the backward retreat sub-cycle.

Various precursor materials may be used for depositing various materials on the substrate using the embodiments described herein. For example, TMA (Trimethylaluminium) may be injected as source precursor, and radicals of oxygen (O*) may be injected as reactant precursor to deposit a layer of $Al_2O_3$, and radicals of nitrogen (N*) may be injected as reactant precursor to deposit a layer of AlN on the substrate by an ALD process. As another example, either TDMAT (Tetrakisdimethylaminotitanium: $[(CH_3)_2N]_4Ti$) or $TiCl_4$ may be injected as source precursor, and radicals of oxygen (O*) or nitrogen (N*) may be injected as reactant precursor to deposit a layer of $TiO_2$ or TiN, respectively, on the substrate. Also, $SiO_2$ film with Diisopropylamidosilane ($SiH_3N(C_3H_7)_2$)) as source precursor and radicals of oxygen (O*) or remote-plasma with ($N_2O+NH_3$) mixed gas may be used.

Metal ALD films can also be deposited using embodiments described herein. For example, DMAH (Dimethyl-aluminum-hydride: $Al(CH_3)_2$) may be injected as source precursor, and radicals of hydrogen (H*) may be injected as reactant precursor to deposit a layer of Al metal film by an ALD process.

Figure 13A:
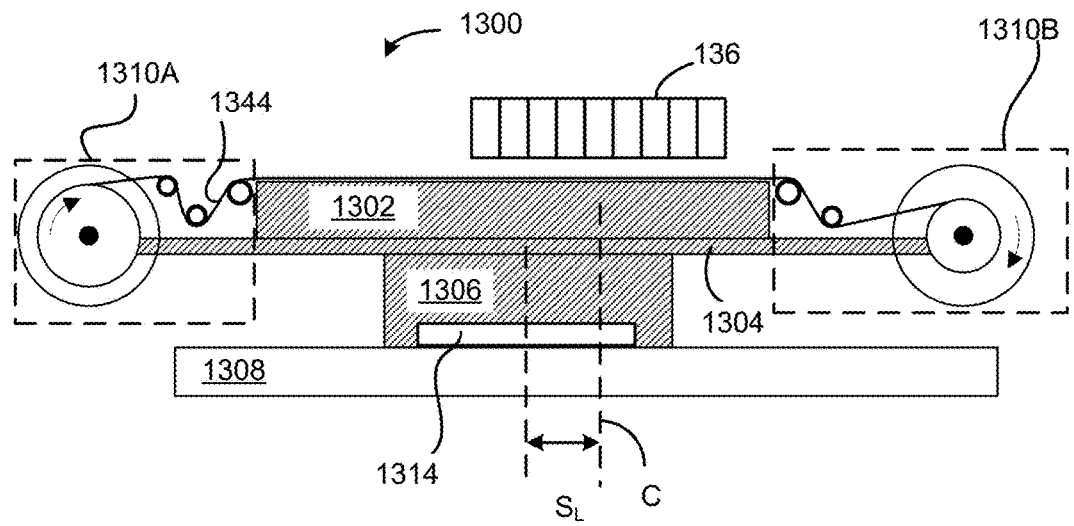
FIG. 13A is a schematic diagram of a support table moved to a left end in a deposition device for depositing a material on a film, according to one embodiment.

FIG. 13A is a schematic diagram of a support table 1302 moved to a left end in a deposition device 1300 for depositing a material on a film 1344, according to one embodiment. In the embodiment of FIG. 13A, deposition is performed on flexible film 1344. The deposition device 1300 includes, among other components, one or more reactor 136, a support table 1302, an extension plate 1304, a raising table 1306, a platform 1308 and roller assemblies 1310A, 1310B. The reactor 136 of FIG. 13A remains in a fixed location along with the platform 1308, and has the same structure and function as the reactor 136 of FIG. 1. Therefore, the detailed description of the reactor 136 is omitted herein for the sake of brevity.

The support table 1302, the extension plate 1304 and the raising table 1306 move relative to the reactors 136 and the platform 1308 to expose the film 1344 to materials or radicals injected by the reactors 136. The support table 1302 has a top surface onto which the film 1344 is laid. The film 1344 may maintain a flat top surface while laid on the support table 1302. The film 1344 placed on the support table 1302 is unrolled from the roller assembly 1310A and rolled onto the roller assembly 1310B during the deposition process.

The extension plate 1304 is fixed to the support table 1302 and the raising table 1306, and has the roller assemblies 1310A, 1310B attached to both ends of the extension plate 1304. Instead of using a plate, any other types of structures (e.g., members) may be used to attach the roller assemblies 1310A, 1310B at locations away from the support table 1302.

The raising table 1306 is placed between the platform 1308 and the support table 1302. The raising table 1306 may include reciprocating mechanism 1314 such as linear motor, rack and pinions and a gear assembly to enable the raising table 1306, along with the support table 1302 and the extension plate 1304, to move relative to the reactors 136 and the platform 1308. In FIG. 13A, the raising table 1306 is moved left from the center "C" by a stroke distance of $S_L$.

Figure 13B:
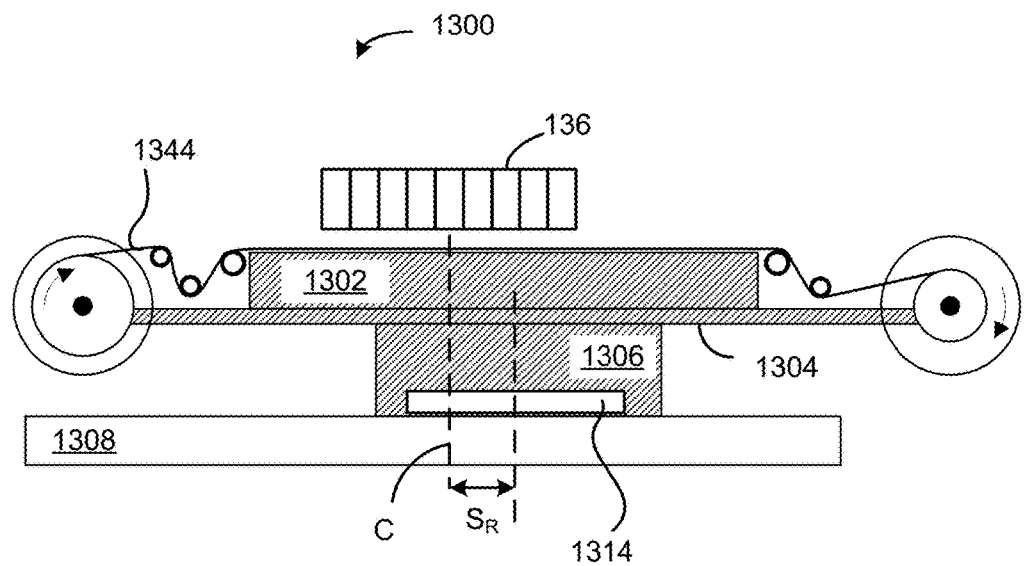
FIG. 13B is a schematic diagram of the support table of FIG. 13B moved to a right end in the deposition device, according to one embodiment.

FIG. 13B is a schematic diagram of the support table 1302 of FIG. 13B moved to a right end in the deposition device 1300 for depositing a material on the film 1344, according to one embodiment. In FIG. 13B, the raising table 1306 is moved right from the center "C" by a stroke distance of $S_R$.

As the support table 1302 reciprocates the movement by the reciprocating mechanism 1314, the film 1344 is injected with different gases to deposit multiple layers of material. However, if only reciprocating motion is performed, different portions of the film 1344 may be deposited with inconsistent and uneven material since different portions of the film are exposed to different materials or radicals and in different sequence. Hence, the roller assemblies 1310A, 1310B unwinds or winds the film 1344 to move the film 1344 as the process of injecting materials or reactants is being performed on the film 1344.

The unwinding or winding of the film 1344 from the roller assemblies may be performed (i) during the reciprocation motions of the raising table 1306, (ii) while the movement of the raising table 1306 relative to the platform 1308 is stopped or (iii) continuously during entire operation of depositing the material on the film 1344. The linear speed of the film 1344 relative to the support table 1302 is slower than the overall speed of the reciprocating motion of the raising table 1306.

The substrate fabricated using such methods can be used in various applications such as display devices or other electronic devices. Depending on the application, various types of substrate may also be used. Example substrates include rigid material (e.g., silicon wafers and glasses) and flexible material (e.g., polymer roll). Further, the substrate may be of various shapes and configuration. For example, the substrate may be rectangular, circular or elliptical. In a non-rectangular shape, the "length" of the substrate may be defined as the distance along the longer axis or the diameter of the substrate.

The series of reactors arranged along the length of the substrate may also different source precursor and reactant precursor to deposit different layers of material on the substrate.

When short-distance reciprocating motions are performed, the thickness and the composition of materials deposited on the substrate may vary depending on the locations of the substrate. By shifting the location of the reciprocating motions or making progressive reciprocating motions where the starting points of the reciprocating motions and the ending points of the reciprocating motions differ, upper layers with relatively consistent thickness and composition are deposited on the substrate. Hence, a high quality layer can be deposited on the substrate despite the short-distance reciprocating motions.

The invention claimed is:

1. A method of depositing a layer on a substrate, comprising:
    (a) causing a relative movement between a substrate and reactors in a first direction by a first distance shorter than a length of the substrate during injection of gas by the reactors;
    (b) causing a relative movement between the substrate and the reactors in a second direction opposite to the first direction by a second distance shorter than the first distance during injection of the gas by the reactors;
    (c) repeating (a) and (b) for a first predetermined number of times;
    (d) causing a relative movement between the substrate and the reactors in the first direction by a third distance shorter than the length of the substrate during injection of the gas by the reactors;
    (e) causing a relative movement between the substrate and the reactors in the second direction by a fourth distance longer than the third distance during injection of the gas by the reactors.

2. The method of claim 1, further comprising (f) repeating (d) and (e) for a second predetermined number of times.

3. The method of claim 2, wherein the first and fourth distances are the same, and the second and third distances are the same.

4. The method of claim 2, wherein a difference between the first and second distances are the same as a different between the fourth and third distances.

5. The method of claim 2, further comprising repeating (a) through (f) for a third predetermined number of times.

6. The method of claim 2, wherein an offset representing the difference between the first distance and the second distance is smaller than a width of a reactor.

7. The method of claim 1, further comprising:
injecting source precursor onto the substrate by a first subset of the reactors;
injecting reactant precursor onto the substrate by a second subset of the reactors; and
injecting purge gas onto the substrate by a third subset of the reactors.

8. The method of claim 1, wherein layers of material are deposited on the substrate by spatial atomic layer deposition (ALD) or chemical vapor deposition (CVD).

9. The method of claim 1, wherein layers of different materials or laminates are deposited on the substrate.

10. The method of claim 1, further comprising
(f) causing a relative movement between the substrate and the reactors in the first direction by a fifth distance different from the third distance;
(g) causing a relative movement between the substrate and the reactors in the second direction by a sixth distance longer than the fifth distance;
(h) repeating (f) and (g) for a second predetermined number of times.

11. The method of claim 10, wherein a position of the substrate after (a) causing the relative movement between the substrate and reactors in the first direction by the first distance and before (b) causing the relative movement between the substrate and the reactors in the second direction by the second distance does not coincide with a position of the substrate after the relative movement after (f) causing the relative movement between the substrate and the reactors in the first direction by the fifth distance and before (g) causing the relative movement between the substrate and the reactors in the second direction by the sixth distance.

12. The method in claim 1, a roll feeding mechanism and a winding mechanism are equipped at the ends of the susceptor and the feeding or winding speed of the roll is relatively slower than the relative movement between a substrate and reactors.

13. A method of depositing a material on a substrate, comprising:
(a) causing a relative movement between a substrate and rectors in a first direction by a first distance shorter than a length of the substrate while injecting precursor materials onto the substrate;
(b) causing a relative movement between the substrate and the reactors in a second direction by the first distance while injecting the precursor materials onto the substrate;
(c) shifting location of the substrate by a second distance shorter than the first distance without injecting the precursor material onto the substrate; and
(d) repeating steps (a) through (c) for a predetermined number of times.

14. The method of claim 13, wherein the second distance corresponds to a width of a reactor.

* * * * *